United States Patent
Ishida et al.

(10) Patent No.: US 7,203,860 B2
(45) Date of Patent: Apr. 10, 2007

(54) CLOCK RECOVERY CIRCUIT FOR HIGH-SPEED DATA SIGNAL TRANSMISSION

(75) Inventors: Hideki Ishida, Kawasaki (JP); Masaaki Kaneko, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 373 days.

(21) Appl. No.: 10/405,243

(22) Filed: Apr. 3, 2003

(65) Prior Publication Data

US 2003/0204767 A1  Oct. 30, 2003

(30) Foreign Application Priority Data

Apr. 26, 2002  (JP) ............... 2002-126281

(51) Int. Cl.
*G06F 1/00* (2006.01)
*G06F 1/04* (2006.01)
*G06F 1/24* (2006.01)
*G06F 11/00* (2006.01)

(52) U.S. Cl. ............... 713/503; 713/500; 398/155

(58) Field of Classification Search ............... 713/500, 713/503
See application file for complete search history.

(56) References Cited

U.S. PATENT DOCUMENTS

| | | | |
|---|---|---|---|
| RE37,452 E * | 11/2001 | Donnelly et al. ............ 327/255 |
| 6,466,071 B2 * | 10/2002 | Kim et al. ............ 327/175 |
| 6,578,154 B1 * | 6/2003 | Wynen et al. ............ 713/500 |
| 6,583,657 B1 * | 6/2003 | Eckhardt et al. ............ 327/175 |
| 6,836,503 B2 * | 12/2004 | Best et al. ............ 375/355 |
| 6,886,106 B2 * | 4/2005 | Brock et al. ............ 713/500 |
| 6,907,472 B2 * | 6/2005 | Mushkin et al. ............ 709/248 |
| 6,915,442 B2 * | 7/2005 | Wynen et al. ............ 713/500 |
| 2001/0030562 A1 * | 10/2001 | Kim et al. ............ 327/175 |

FOREIGN PATENT DOCUMENTS

JP  2001-144590  5/2001

OTHER PUBLICATIONS

Ogawa et al., "A 50% Duty Control Circuit for PLL Output", ECT-01-72, pp. 15-19 (2001).
Lee et al., "A 2.5 V CMOS Delay-Locked Loop for an 18 Mbit, 500 Megabyte/s DRAM", Solid State Circuits, J. of IEEE, vol. 29, Issue 12, pp. 1491-1496 (1994).

\* cited by examiner

*Primary Examiner*—Rehana Perveen
*Assistant Examiner*—Michael J. Brown
(74) *Attorney, Agent, or Firm*—Arent Fox, LLP

(57) ABSTRACT

A clock recovery circuit has a phase comparator circuit, a phase adjusting circuit, and a duty cycle correction circuit. The phase comparator circuit carries out phase comparison between an input signal and an output signal, and outputs a phase control signal proportional to a phase difference between the input signal and the output signal. The phase adjusting circuit receives the phase control signal from the phase comparator circuit, adjusts the phase of the input signal, and produces the output signal, and the duty cycle correction circuit receives the output signal from the phase adjusting circuit, and corrects the duty cycle of the output signal.

7 Claims, 11 Drawing Sheets

CLOCK RECOVERY CIRCUIT FOR HIGH-SPEED DATA SIGNAL TRANSMISSION

CROSS REFERENCE TO RELATED APPLICATION

This application is based upon and claims the benefit of priority from the prior Japanese Patent Application No. 2002-126281, filed on Apr. 26, 2002, the entire contents of which are incorporated herein by reference.

BACKGROUND OF THE INVENTION

1. Field of the Invention

The present invention relates to a clock recovery circuit and, more particularly, to a clock recovery circuit to be used for high-speed data signal transmission.

2. Description of the Related Art

Recently, the performance of components used in computers and other information processing apparatuses has been greatly improved. In particular, dramatic improvements have been made, for example, in the performance of semiconductor memory devices such as SRAMs (Static Random Access Memories) and DRAMs (Dynamic Random Access Memories), and other semiconductor devices such as processors and switching LSIs.

The improvements in the performance of semiconductor memory devices, processors, and the like have reached the point where system performance cannot be improved further unless the speed of signal transmission between components or elements is increased. Specifically, the speed gap between a DRAM and a processor (i.e., between LSIs), for example, has been widening year by year, and in recent years, this speed gap has been becoming a bottleneck impeding performance improvement for a computer as a whole. Furthermore, with increasing integration and increasing size of semiconductor chips, the speed of signal transmission between elements or circuit blocks within a chip is becoming a major factor limiting the performance of the chip. Moreover, the speed of signal transmission between a peripheral device and the processor/chipset is also becoming a factor limiting the overall performance of the system.

Generally, in high-speed signal transmission between circuit blocks or chips or between cabinets, a clock used to discriminate between data "0" and data "1" is generated (recovered) using a clock recovery circuit at the receiving end. The recovered clock is phase-adjusted by a phase adjusting circuit in the clock recovery circuit so that the clock has a constant phase relationship with respect to the received signal in order to ensure correct signal reception at all times. The process of recovering the clock and discriminating the data using the thus recovered clock is called the CDR (Clock and Data Recovery); here, to achieve high-speed signal transmission, for example, the duty cycle of the recovered clock must be controlled accurately. Therefore, it is strongly demanded to provide a clock recovery circuit capable of maintaining the duty cycle of the recovered clock at a prescribed value.

The prior art and its associated problem will be described in detail later with reference to relevant drawings.

SUMMARY OF THE INVENTION

An object of the present invention is to provide a clock recovery circuit capable of maintaining the duty cycle of the recovered clock at a prescribed value.

According to the present invention, there is provided a clock recovery circuit comprising a phase comparator circuit carrying out phase comparison between an input signal and an output signal, and outputting a phase control signal proportional to a phase difference between the input signal and the output signal; a phase adjusting circuit receiving the phase control signal from the phase comparator circuit, adjusting the phase of the input signal, and producing the output signal; and a duty cycle correction circuit receiving the output signal from the phase adjusting circuit, and correcting the duty cycle of the output signal.

The duty cycle correction circuit may correct the duty cycle of the output signal to 50%. The input signal and the output signal may be each a differential signal, and the duty cycle correction circuit may correct the center voltage of the output signal. The phase adjusting circuit may comprise a plurality of differential transistor pairs to which reference clocks of different phases are input, and a plurality of current sources controlling currents flowing through the respective differential transistor pairs, and wherein the duty cycle correction circuit may control the center voltage of a node to which the plurality of differential transistor pairs are connected in common. Each of the current sources may apply a weight proportional to the output of the phase comparator circuit to the reference clock supplied to the differential transistor pair corresponding to the each current source.

The duty cycle correction circuit may make the center voltage of a positive logic signal in the output signal and the center voltage of a negative logic signal in the output signal coincide with each other. The duty cycle correction circuit may comprise a potential difference detection circuit detecting a potential difference between the center voltage of the positive logic signal in the output signal and the center voltage of the negative logic signal in the output signal, and a feedback control circuit feedback-controlling the phase adjusting circuit by receiving an output of the potential difference detection circuit. The potential difference detection circuit may comprise a differential amplifier receiving the differential output signals, and the feedback control circuit may comprise a pair of pull-up or pull-down transistors controlling the levels of the output signals by receiving outputs of the differential amplifier. A capacitor connected to a high-level or low-level power supply line may be provided on each of the outputs of the differential amplifier.

The duty cycle correction circuit may make the center voltage of a positive logic signal in the output signal and the center voltage of a negative logic signal in the output signal coincide with a reference voltage. The duty cycle correction circuit may comprise a first potential difference detection circuit detecting a potential difference between the reference voltage and the center voltage of the positive logic signal in the output signal, a second potential difference detection circuit detecting a potential difference between the reference voltage and the center voltage of the negative logic signal in the output signal, and a feedback control circuit feedback-controlling the phase adjusting circuit by receiving outputs of the first and second potential difference detection circuits.

The first potential difference detection circuit may comprise a first differential amplifier receiving the positive logic output signal and the reference voltage, the second potential difference detection circuit comprises a second differential amplifier receiving the negative logic output signal and the reference voltage, and the feedback control circuit may comprise a pair of pull-up or pull-down transistors controlling the levels of the output signals by receiving the outputs of the first and second differential amplifiers. A capacitor connected to a high-level or low-level power supply line may be provided on each of the outputs of the first and second differential amplifiers. The phase adjusting circuit may be provided in a plurality of stages, and wherein the duty cycle correction circuit may correct the duty cycle of the output signal of the first-stage phase adjusting circuit, the output signal of the first-stage phase adjusting circuit may be used as a reference clock for the next-stage phase adjusting circuit, and the output signal of the final-stage phase adjusting circuit may be taken as the output signal of the clock recovery circuit.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of a clock recovery circuit according to the present invention, a prior art clock recovery circuit and its associated problem will be described with reference to the drawings.

To speed up signal transmission between LSIs, for example, the signal receiving circuit must operate with accurate timing to each incoming signal, and it is known, in the prior art, to provide a clock recovery circuit having a phase adjusting circuit in a feedback loop as a means for generating such accurate timing.

Figure 1:
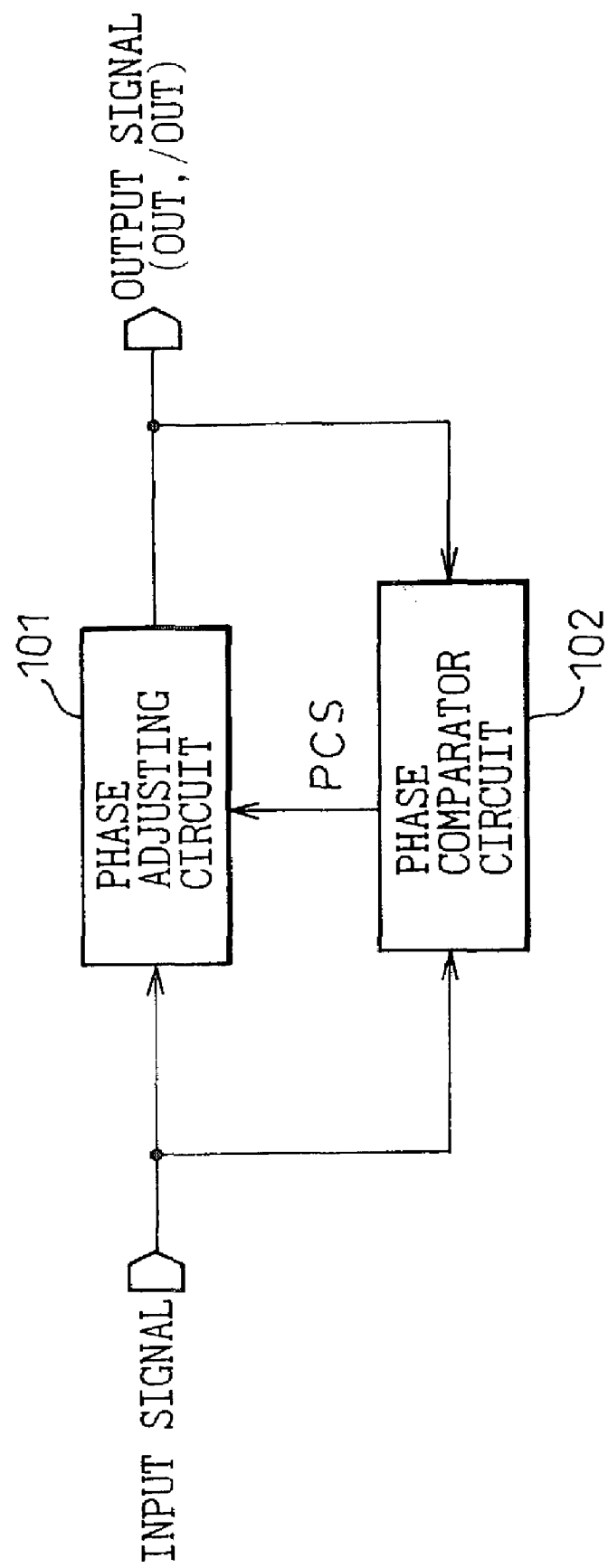
FIG. 1 is a block diagram schematically showing one example of a prior art clock recovery circuit.

FIG. 1 is a block diagram schematically showing one example of the prior art clock recovery circuit.

As shown in FIG. 1, the prior art clock recovery circuit comprises a phase adjusting circuit 101, which is supplied with an input signal and an output (phase control signal) PCS of a phase comparator circuit 102, and the phase comparator circuit 102, which is supplied with the input signal and an output signal.

The phase comparator circuit 102 performs phase comparison between the input signal and the output signal, and outputs the phase control signal PCS responsive to the result of the comparison. More specifically, the phase comparator circuit 102 compares the phases of the input signal and the output signal, and supplies to the phase adjusting circuit 101 the phase control signal PCS of a digital or analog level proportional to the phase difference between the input signal and the output signal.

The phase adjusting circuit 101 applies a phase difference to the input signal in accordance with the phase control signal PCS supplied from the phase comparator circuit 102, and produces the output signal. In FIG. 1, a delay occurs in the output of the phase adjusting circuit 101 due to a parasitic capacitance inherent, for example, in an LSI or the like, but it has no direct relevance to the present invention and, therefore, is not shown here.

Here, if the output signal is advanced in phase with respect to the input signal, for example, the phase comparator circuit 102 supplies the phase adjusting circuit 101 with the phase control signal PCS produced so as to delay the output phase compared with the phase of the current output signal; conversely, if the output signal is delayed in phase with respect to the input signal, the phase comparator circuit 102 supplies the phase adjusting circuit 101 with the phase control signal PCS produced so as to advance the output phase compared with the phase of the current output signal.

Figure 2:
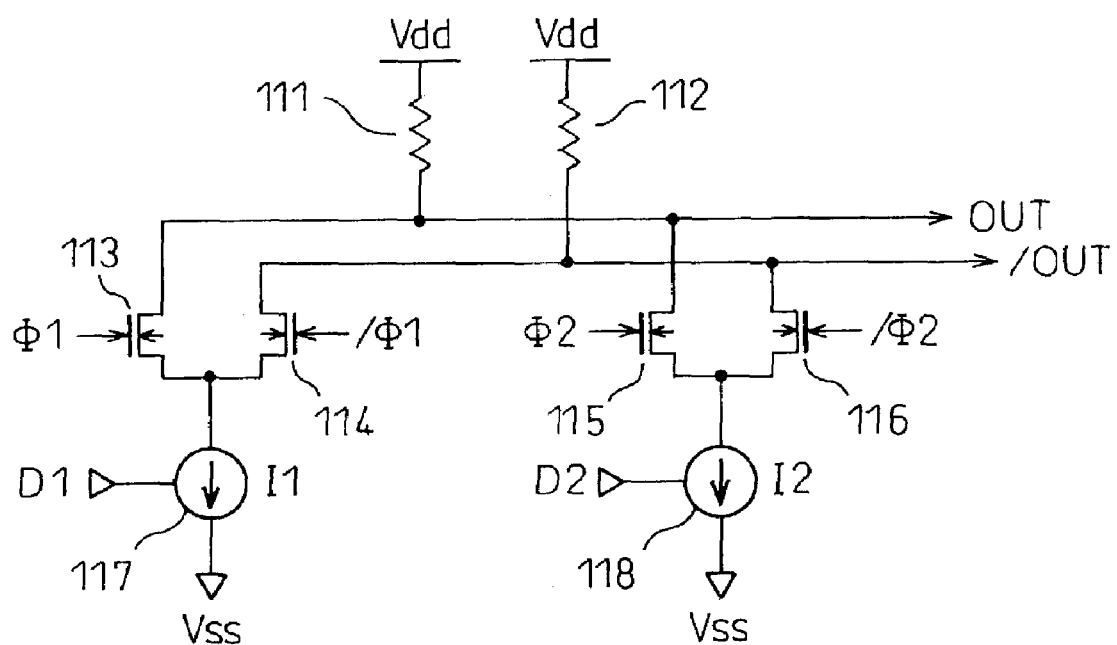
FIG. 2 is a circuit diagram showing one example of a phase adjusting circuit in the clock recovery circuit of FIG. 1.

FIG. 2 is a circuit diagram showing one example of the phase adjusting circuit 101 in the clock recovery circuit of FIG. 1. In FIG. 2, reference numerals 111 and 112 are loads, 113 to 116 are n-channel MOS transistors (nMOS transistors), and 117 and 118 are current sources. Here, the transistors 113 and 114 and the transistors 115 and 116, respectively, form differential transistor pairs.

Reference characters D1 and D2 are weight signals corresponding to the phase control signal PCS supplied from the phase comparator circuit 102, and $\Phi1$, $\Phi2$, $/\Phi1$, and $/\Phi2$ are four phase clocks 90° apart in phase relative to each other. That is, the clock $\Phi1$ is a signal with a phase difference of 0°, the clock $\Phi2$ is a signal with a phase difference of 90°, the clock $/\Phi1$ is a signal with a phase difference of 180°, and the clock $/\Phi2$ is a signal with a phase difference of 270°.

As shown in FIG. 2, the weight signal D1 controls the value of the current I1 flowing through the current source 117, and applies a weight (D1) to the 0° phase clock $\Phi1$ (the 180° phase clock $/\Phi1$), while the weight signal D2 controls the value of the current I2 flowing through the current source 118, and applies a weight (D2) to the 90° phase clock $\Phi2$ (the 270° phase clock $/\Phi2$); by combining these, output signals OUT and /OUT, having a phase difference corresponding to the weight signals D1 and D2, are produced.

Figure 3:
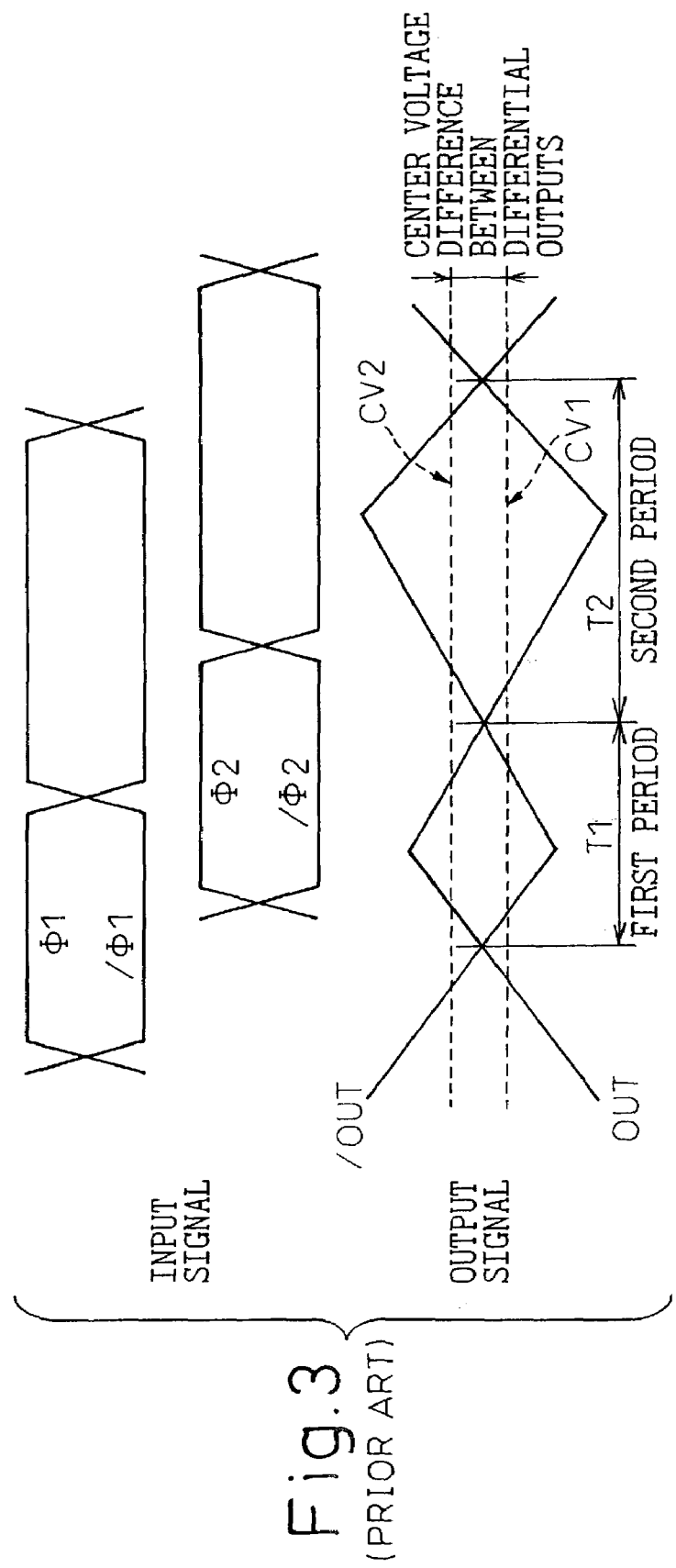
FIG. 3 is a diagram for explaining a problem associated with the clock recovery circuit of FIG. 1.

FIG. 3 is a diagram for explaining a problem associated with the clock recovery circuit of FIG. 1, and shows in a conceptual form the waveforms in the phase adjusting circuit 101 of FIG. 2.

As described above, the phase adjusting circuit 101 of FIG. 2 applies weights to the 0° phase clock $\Phi1$ (the 180° phase clock $/\Phi1$) and the 90° phase clock $\Phi2$ (the 270° phase clock $/\Phi2$), respectively, using the weight signals D1 and D2 supplied from the phase comparator circuit 102, and combines (composites) them to produce the output signals OUT and /OUT.

As shown in FIG. 3, the output signal OUT is obtained as a triangular wave by combining the 0° phase clock Φ1 to which the weight D1 is applied and the 90° phase clock Φ2 to which the weight D2 is applied, while the output signal /OUT is obtained as a triangular wave by combining the 180° phase clock /Φ1 to which the weight D1 is applied and the 270° phase clock /Φ2 to which the weight D2 is applied.

Here, since the actual input signal is input via a signal transmission line, device, etc., the input signal is affected by variations in the characteristics of the signal transmission line, device, etc.; as a result, the input signal is supplied, not as an ideal clock with a 50% duty cycle (the ratio of the high level "H" period to the low level "L" period in one cycle is 1:1), but as a clock whose duty cycle is displaced from 50%.

If the input signal (clock) whose duty cycle is displaced is supplied, there occurs, for example, a difference between the center voltages of the differential output signals OUT and /OUT composited in the phase adjusting circuit 101. That is, as shown in FIG. 3, the center voltage CV1 of the positive logic output signal OUT differs from the center voltage CV2 of the negative logic output signal /OUT, and as a result, the first period T1 during which the positive logic output signal OUT is high "H" (the negative logic output signal /OUT is low "L") differs in length from the second period T2 during which the positive logic output signal OUT is low "L" (the negative logic output signal /OUT is high "H"), causing the duty cycle to deviate from 50% (T1<T2).

The duty cycle deviation of the output signal OUT, /OUT (the output clock of the clock recovery circuit) of the phase adjusting circuit 101 is propagated to various circuits at subsequent stages that use the clock OUT, /OUT, and this can result in malfunctioning or performance degradation of the system or the LSI itself.

Next, the basic functional configuration of the clock recovery circuit according to the present invention will be described.

Figure 4:
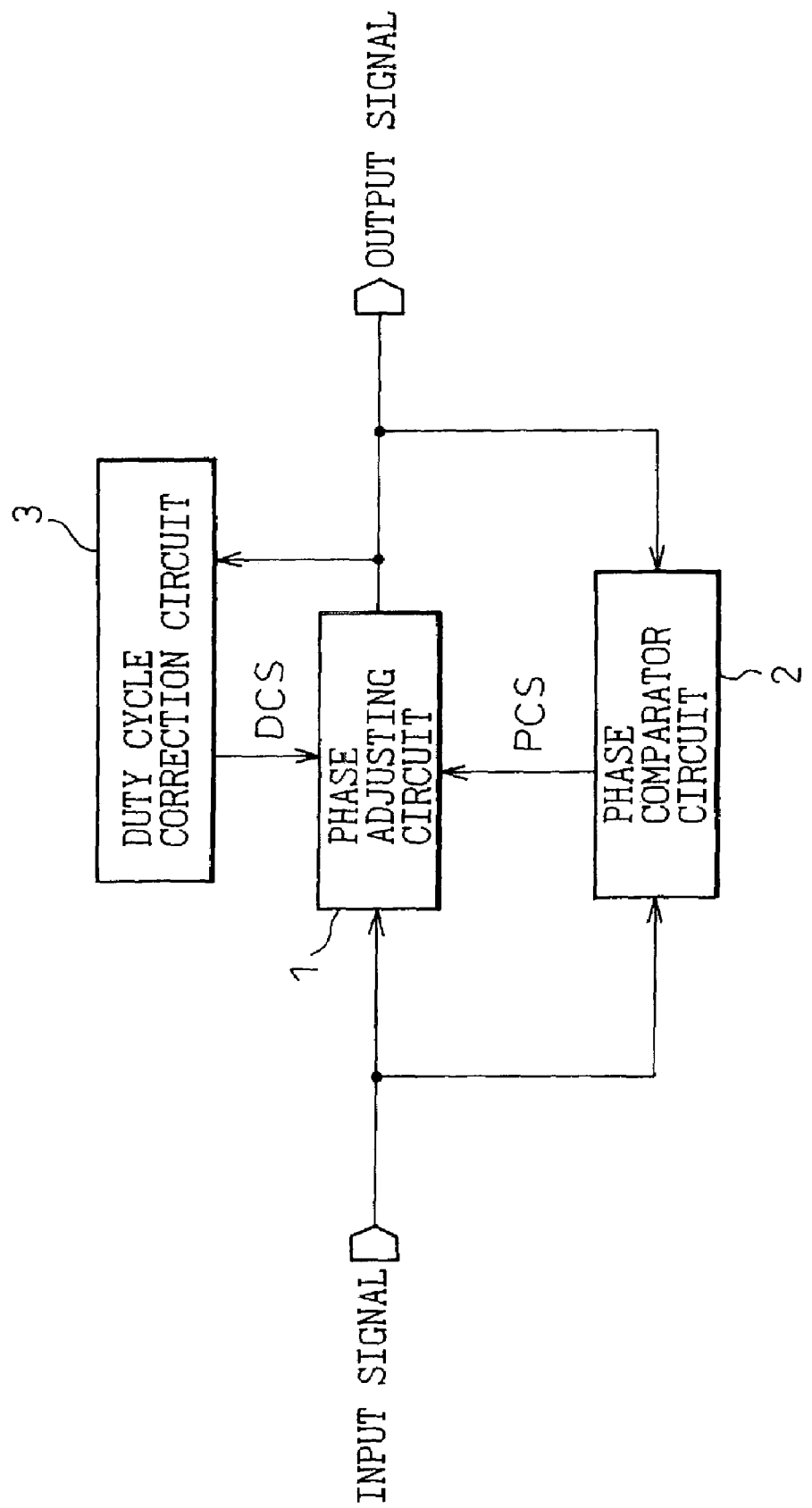
FIG. 4 is a block diagram schematically showing the basic functional configuration of a clock recovery circuit according to the present invention.

FIG. 4 is a block diagram schematically showing the basic functional configuration of the clock recovery circuit according to the present invention.

As shown in FIG. 4, the clock recovery circuit of the present invention comprises a phase adjusting circuit 1, which is supplied with an input signal and an output (phase control signal) PCS of a phase comparator circuit 2, the phase comparator circuit 2, which is supplied with the input signal and an output signal, and a duty cycle correction circuit 3. Here, the phase adjusting circuit 1 and the phase comparator circuit 2 in the clock recovery circuit of the present invention are basically the same as the corresponding circuits in the prior art clock recovery circuit previously shown in FIG. 1.

The phase comparator circuit 2 compares the phases of the input signal and the output signal, and supplies to the phase adjusting circuit 1 the phase control signal PCS of a digital or analog level proportional to the phase difference between the input signal and the output signal. The phase adjusting circuit 1 applies a phase difference to the input signal in accordance with the phase control signal PCS supplied from the phase comparator circuit 2, and produces the output signal. In FIG. 4, a delay occurs in the output of the phase adjusting circuit 1 due to a parasitic capacitance inherent, for example, in an LSI or the like, but it has no direct relevance to the present invention and, therefore, is not shown (this also applies to the diagrams hereinafter given, except FIG. 10).

Here, if the output signal is advanced in phase with respect to the input signal, for example, the phase comparator circuit 2 supplies the phase adjusting circuit 1 with the phase control signal PCS produced so as to delay the output phase compared with the phase of the current output signal; conversely, if the output signal is delayed in phase with respect to the input signal, the phase comparator circuit 2 supplies the phase adjusting circuit 1 with the phase control signal PCS produced so as to advance the output phase compared with the phase of the current output signal.

Figure 5:
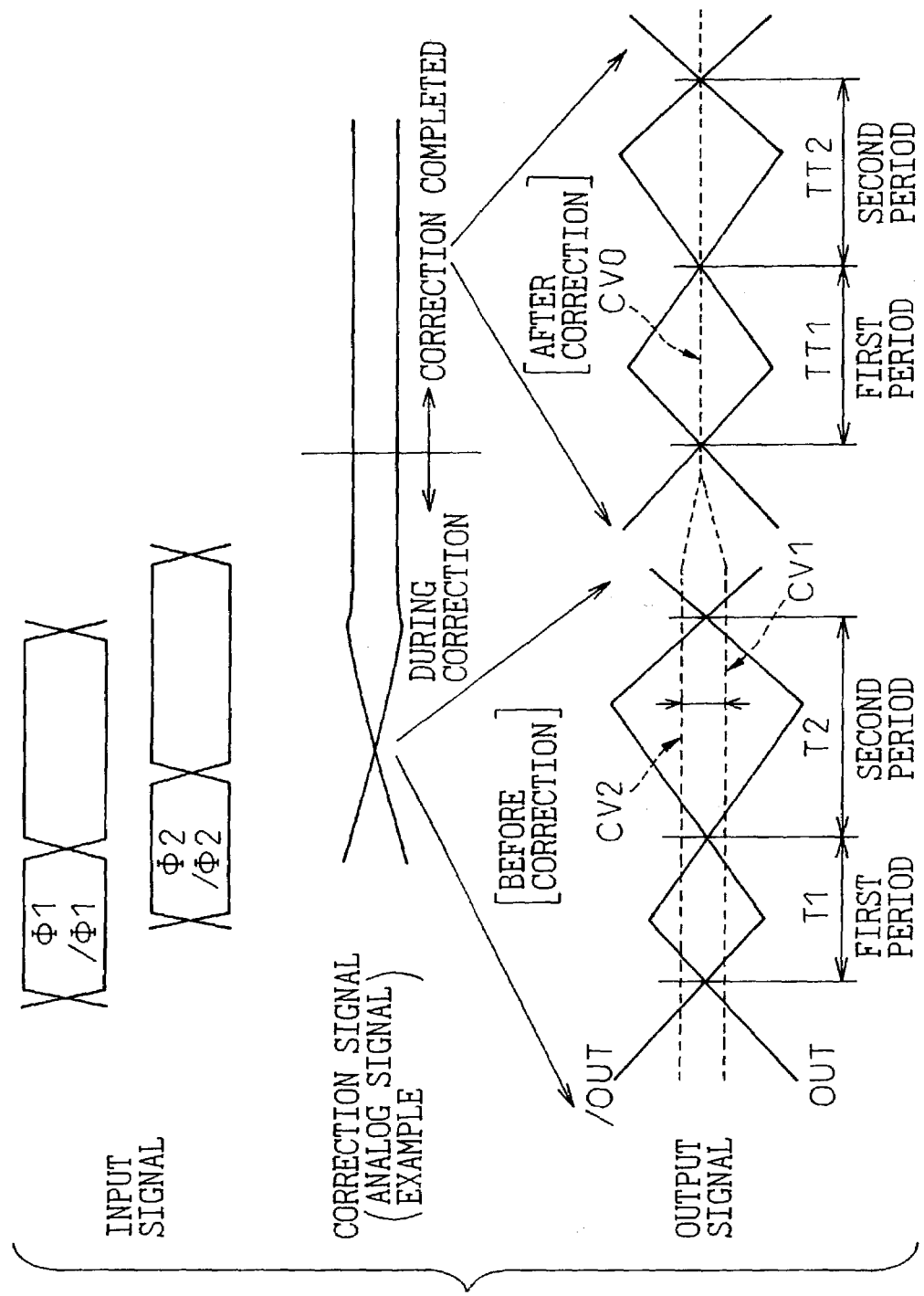
FIG. 5 is a diagram for explaining one example of the operation performed in the clock recovery circuit of FIG. 4.

FIG. 5 is a diagram for explaining one example of the operation performed in the clock recovery circuit of FIG. 4 for comparison with the prior art clock recovery circuit previously shown in FIGS. 1 and 2.

As previously explained with reference to FIG. 3, as the actual input signal is input via a signal transmission line, device, etc., the input signal is affected by variations in the characteristics of the signal transmission line, device, etc.; as a result, the input signal is supplied, not as an ideal clock with a 50% duty cycle, but as a clock whose duty cycle is displaced from 50%. If the input signal (clock) whose duty cycle is displaced is supplied, there occurs a difference between the center voltage CV1 of the positive logic output signal OUT and the center voltage CV2 of the negative logic output signal /OUT, and as a result, the first period T1 during which the positive logic output signal OUT is high "H" (the negative logic output signal /OUT is low "L") differs in length from the second period T2 during which the positive logic output signal OUT is low "L" (the negative logic output signal /OUT is high "H"), causing the duty cycle to deviate from 50% (T1<T2: see FIG. 3 and [BEFORE CORRECTION] in FIG. 5).

In the clock recovery circuit of the present invention, the duty cycle of the output signal OUT, /OUT is corrected by the duty cycle correction circuit 3. The duty cycle correction circuit 3 can correct the duty cycle to 50%, for example, by making the center voltage CV1 of the differential output signal OUT, /OUT and the center voltage CV2 of the negative logic signal /OUT coincide with each other (CV0) and thereby making the first period TT1 and the second period TT2 equal in length (TT1=TT2: see [AFTER CORRECTION] in FIG. 5).

Here, at the same time that the clock recovery circuit starts operation, the duty cycle correction circuit 3 starts monitoring the output of the phase adjusting circuit 1, and continues to send the result of the correction to the phase adjusting circuit 1. When a prescribed time has elapsed from the start of the correction by the duty cycle correction circuit 3 to the completion of the correction, the output of the duty cycle correction circuit 3 stabilizes and the duty cycle of the output signal (OUT, /OUT) is maintained at the prescribed value (50%). In FIG. 5, the correction signal is shown as an analog signal, but a digital signal may be used to perform control using digital code.

In this way, according to the clock recovery circuit of the present invention, if an input signal whose duty cycle is displaced is supplied, for example, an output signal with the ideal duty cycle can be produced by applying a correction to the input signal, and the duty cycle of the recovered clock can be maintained at the prescribed value.

Embodiments of the clock recovery circuit of the present invention will be described in detail below with reference to the accompanying drawings.

Figure 6:
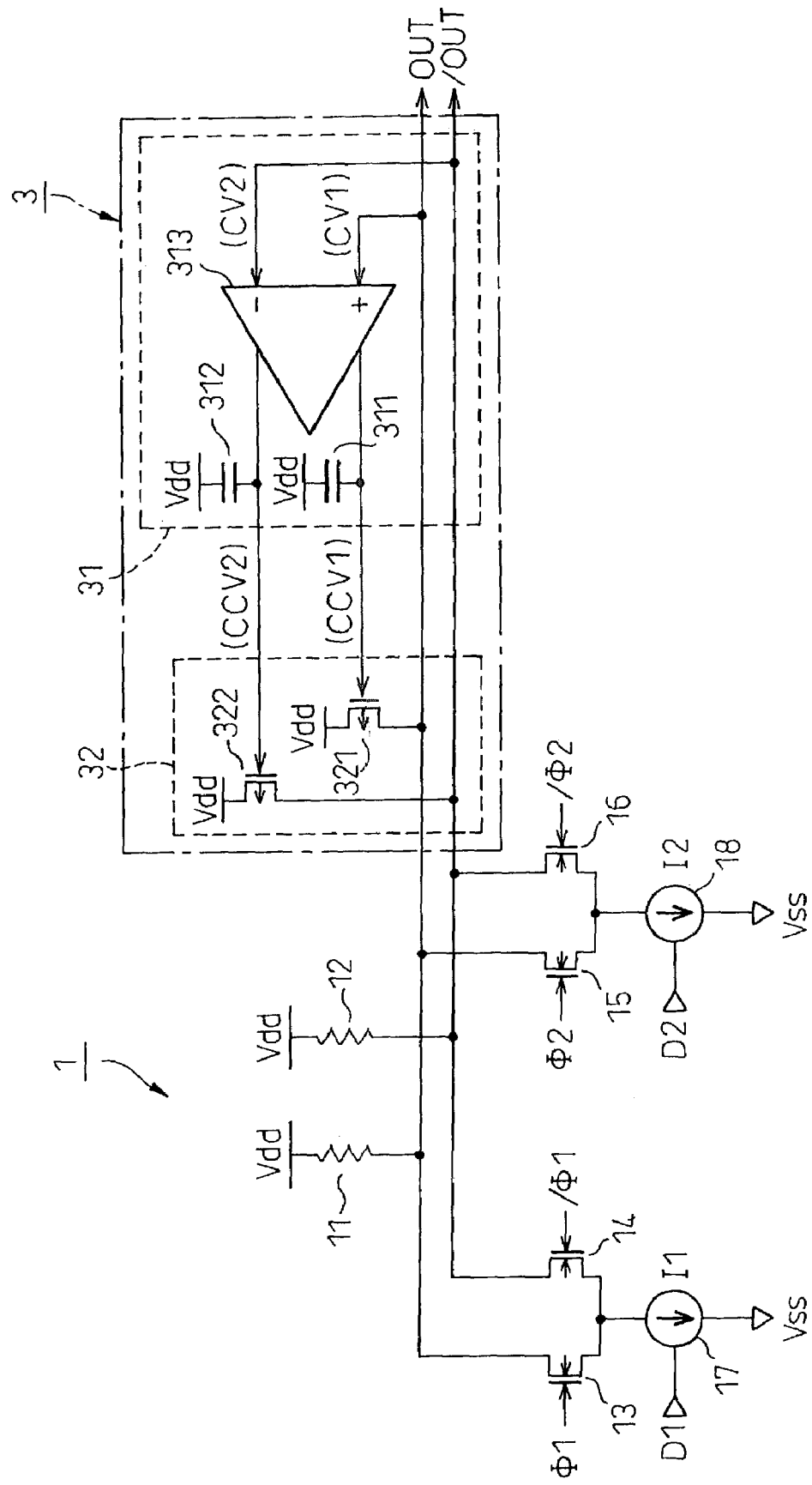
FIG. 6 is a circuit diagram showing a phase adjusting circuit and a duty cycle correction circuit according to a first embodiment of the clock recovery circuit of the present invention.

FIG. 6 is a circuit diagram showing a phase adjusting circuit and a duty cycle correction circuit according to a first embodiment of the clock recovery circuit of the present invention.

As is apparent from the comparison between FIG. 6 and FIG. 2, the clock recovery circuit of the first embodiment differs from the prior art clock recovery circuit (phase adjusting circuit 101) shown in FIG. 2 by the inclusion of the duty cycle correction circuit 3, but the phase adjusting circuit 1 is identical in configuration to the prior art phase adjusting circuit 101 of FIG. 2.

That is, the phase adjusting circuit 1 comprises loads 11 and 12, nMOS transistors 13 to 16, and current sources 17 and 18. Here, the transistors 13 and 14 and the transistors 15 and 16, respectively, form differential transistor pairs.

Reference characters D1 and D2 are weight signals corresponding to the phase control signal PCS supplied from the phase comparator circuit 2, and Φ1, Φ2, /Φ1, and /Φ2 are four phase clocks 90° apart in phase relative to each other. That is, the clock Φ1 is a signal with a phase difference of 0°, the clock Φ2 is a signal with a phase difference of 90°, the clock /Φ1 is a signal with a phase difference of 180°, and the clock /Φ2 is a signal with a phase difference of 270°.

As shown in FIG. 6, the weight signal D1 controls the value of the current I1 flowing through the current source 17, and applies a weight (D1) to the 0° phase clock Φ1 (the 180° phase clock /Φ1), while the weight signal D2 controls the value of the current I2 flowing through the current source 18, and applies a weight (D2) to the 90° phase clock Φ2 (the 270° phase clock /Φ2); by combining these, output signals OUT and /OUT having a phase difference corresponding to the weight signals D1 and D2 are produced.

The duty cycle correction circuit 3 controls the center voltages of the nodes (output nodes) to which the differential transistor pairs 13, 14 and 15, 16 are connected in common, and thereby makes the center voltage (CV1) of the positive logic output signal OUT and the center voltage (CV2) of the negative logic output signal /OUT coincide with each other. The duty cycle correction circuit 3 comprises a potential difference detection circuit 31 and a feedback control circuit 32. The potential difference detection circuit 31 includes a differential amplifier (comparator) 313 for detecting the potential difference between the center voltage of the positive logic output signal OUT and the center voltage of the negative logic output signal /OUT, while the feedback control circuit 32 comprises pull-up p-channel MOS transistors (pMOS transistors) 321 and 322 whose gates are coupled to the outputs of the differential amplifier 313.

The pMOS transistors 321 and 322, which are provided between a high-level power supply line Vdd and the output nodes (OUT and /OUT), receive at their gates the outputs of the differential amplifier 313 produced according to the potential difference between the center voltages of the output signals OUT and /OUT, and operate to make the center voltages (CV1 and CV2) of the output signals OUT and /OUT coincide with each other, thereby correcting the duty cycle of the output signal to 50%. Here, the potential difference detection circuit 31 includes, in addition to the differential amplifier 313, capacitors 311 and 312 which are connected between the high-level power supply line Vdd and the respective outputs of the differential amplifier 313 and serve to reduce the high frequency components contained in the control signals to be fed back to the gates of the respective pMOS transistors 321 and 322.

In a specific example, consider the case shown in [BEFORE CORRECTION] in FIG. 5 in which, between the differential output signals OUT and /OUT, the center voltage (CV1) of the positive logic output signal OUT is lower than the center voltage (CV2) of the negative logic output signal /OUT (CV1<CV2); in this case, the voltage value of the correction signal CCV1 output from the differential amplifier 313 becomes lower than the voltage value of the other correction signal CCV2. That is, the output voltage adjusting pMOS transistor 321 for the positive logic output signal OUT turns on by receiving the correction signal CCV1 of the lower voltage value at its gate, and pulls up the positive logic output node (OUT) to the high-level power supply (Vdd) side. If, in this process, the center voltage (CV1) of the positive logic output signal OUT becomes too high compared with the center voltage (CV2) of the negative logic output signal /OUT (CV1>CV2), the gate voltage (correction signal CCV1) of the transistor 321 rises and the ability of the transistor 321 to pull up the positive logic output node (OUT) decreases; at the same time, the gate voltage (correction signal CCV2) of the transistor 322 drops and the ability of the transistor 322 to pull up the negative logic output node (/OUT) increases.

When a prescribed time elapses while repeating the above process, the center voltage (CV1) of the positive logic output signal OUT becomes identical with the center voltage (CV2) of the negative logic output signal /OUT, and the correction signals CCV1 and CCV2 stabilize.

Figure 7:
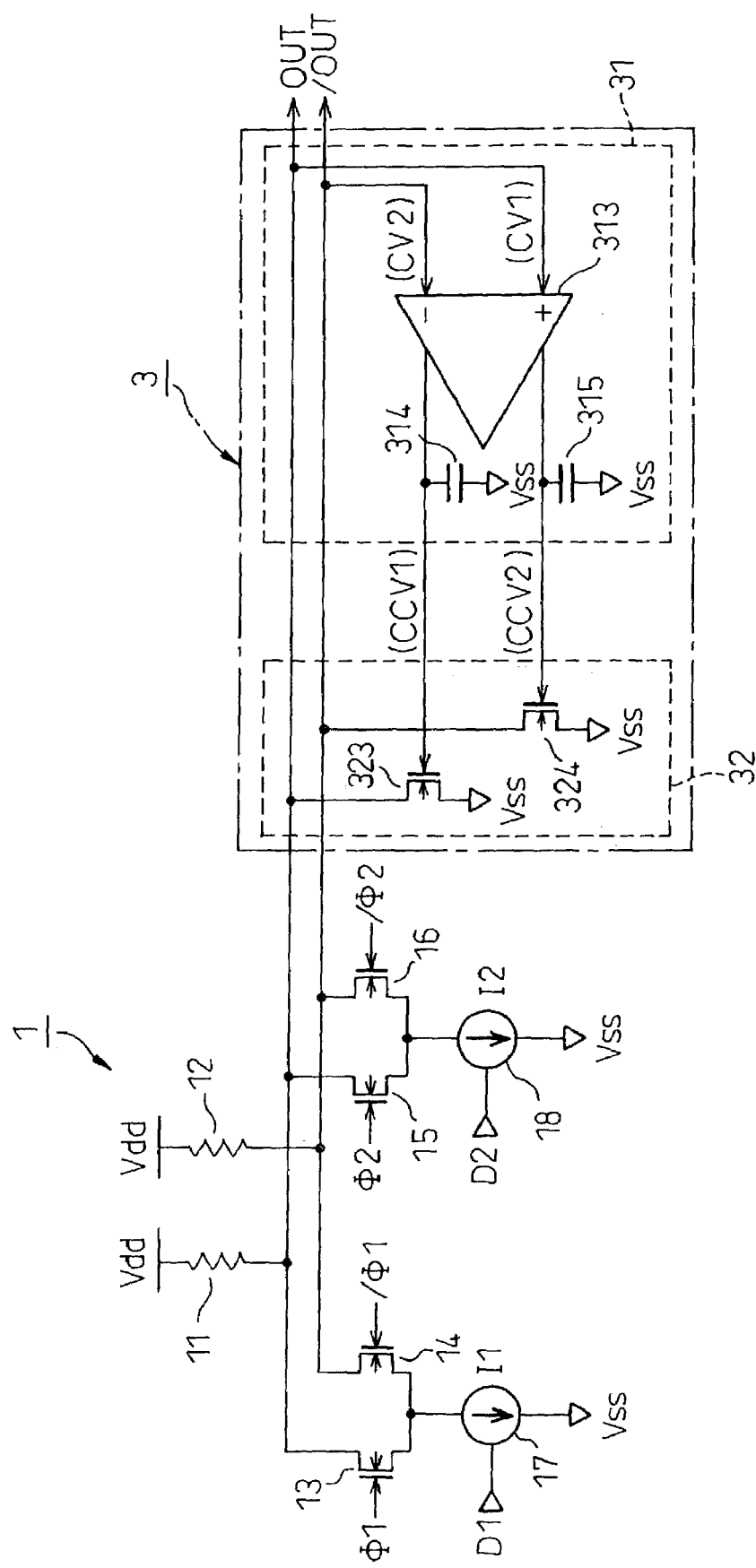
FIG. 7 is a circuit diagram showing a phase adjusting circuit and a duty cycle correction circuit according to a second embodiment of the clock recovery circuit of the present invention.

FIG. 7 is a circuit diagram showing a phase adjusting circuit and a duty cycle correction circuit according to a second embodiment of the clock recovery circuit of the present invention.

As is apparent from the comparison between FIG. 7 and FIG. 6, the clock recovery circuit of the second embodiment differs from the first embodiment in that the capacitors 311 and 312 connected between the high-level power supply line Vdd and the respective outputs of the differential amplifier 313 in the potential difference circuit 313 in the duty cycle correction circuit 3 are replaced by capacitors 314 and 315 connected between the low-level power supply line Vss and the respective outputs of the differential amplifier 313, and in that the pull-up pMOS transistors 321 and 322 in the feedback control circuit 32 in the duty cycle correction circuit 3 are replaced by pull-down nMOS transistors 323 and 324. That is, the nMOS transistors 323 and 324, which are provided between the low-level power supply line Vss and the output nodes (OUT and /OUT), receive at their gates the outputs of the differential amplifier 313 produced according to the potential difference between the center voltages of the output signals OUT and /OUT, and operate to make the center voltages (CV1 and CV2) of the output signals OUT and /OUT coincide with each other, thereby correcting the duty cycle of the output signal to 50%.

In a specific example, consider the case in which, between the differential output signals OUT and /OUT, the center voltage (CV1) of the positive logic output signal OUT is lower than the center voltage (CV2) of the negative logic output signal /OUT (CV1<CV2); in this case, the voltage value of the correction signal CCV2 output from the differential amplifier 313 becomes higher than the voltage value of the other correction signal CCV1 (the voltage value of the correction signal CCV1 becomes lower than the voltage value of the correction signal CCV2). That is, the output voltage adjusting nMOS transistor 324 for the negative logic output signal /OUT turns on by receiving the correction signal CCV2 of the higher voltage value at its gate, and pulls down the negative logic output node (/OUT) to the low-level power supply (Vss) side. If, in this process, the center voltage (CV2) of the negative logic output signal /OUT becomes too low compared with the center voltage (CV1) of the positive logic output signal OUT (CV1>CV2), the gate voltage (correction signal CCV1) of the transistor 324 drops and the ability of the transistor 324 to pull down the negative logic output node (/OUT) decreases; at the same time, the gate voltage (correction signal CCV2) of the transistor 323 rises and the ability of the transistor 323 to pull down the positive logic output node (OUT) increases.

When a prescribed time elapses while repeating the above process, the center voltage (CV1) of the positive logic output signal OUT becomes identical with the center voltage (CV2) of the negative logic output signal /OUT, and the correction signals CCV1 and CCV2 stabilize.

As described above, according to the clock recovery circuit of each of the first and second embodiments of the present invention, if an input signal whose duty cycle is displaced is supplied, for example, the output signal can be generated by correcting the duty cycle; this ensures recovery of the correct clock signal within a board or an LSI chip, and enables accurate and high-speed signal transmission to be performed between blocks.

Figure 8:
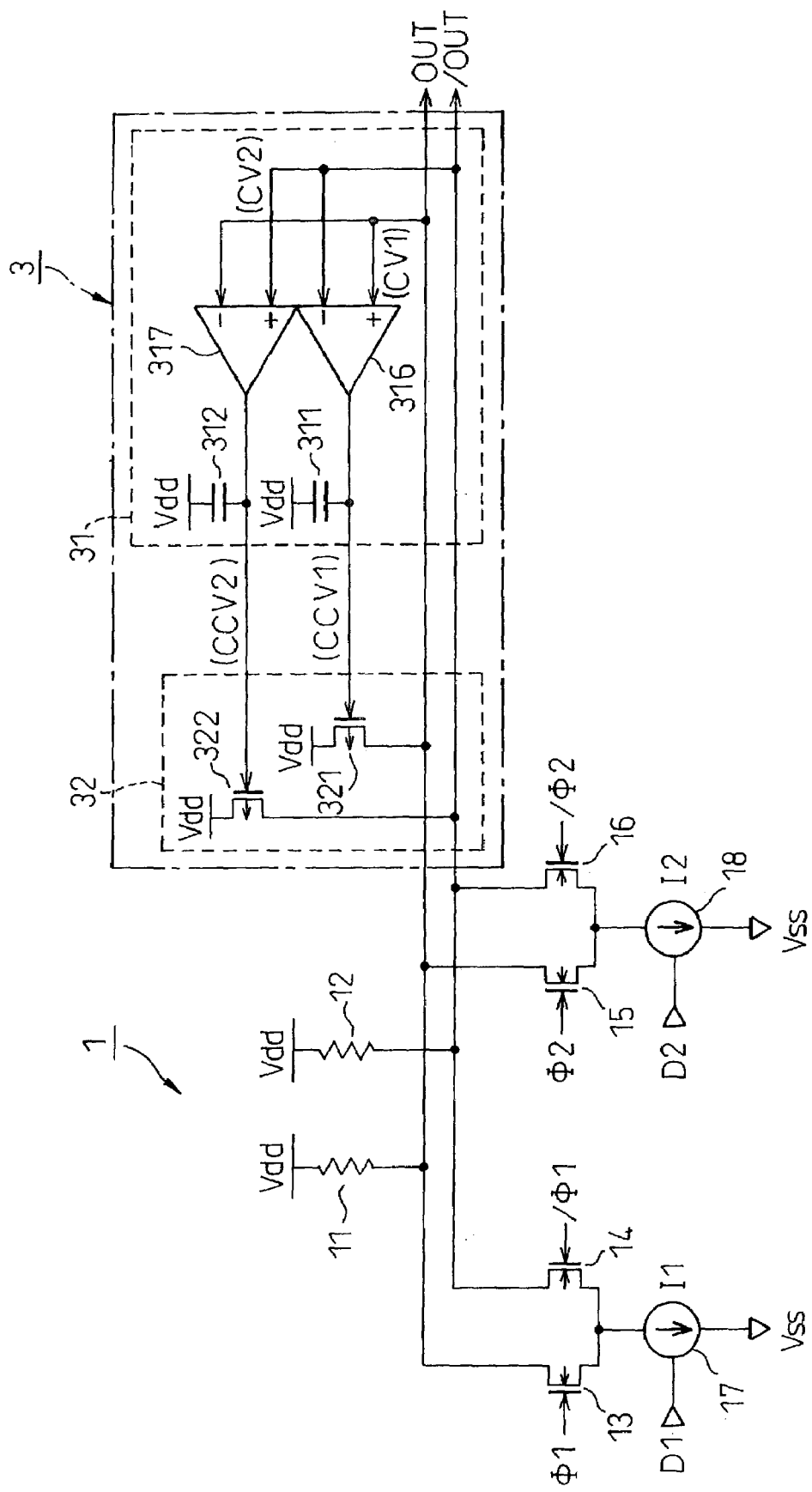
FIG. 8 is a circuit diagram showing a phase adjusting circuit and a duty cycle correction circuit according to a third embodiment of the clock recovery circuit of the present invention.

FIG. 8 is a circuit diagram showing a phase adjusting circuit and a duty cycle correction circuit according to a third embodiment of the clock recovery circuit of the present invention.

As is apparent from the comparison between FIG. 8 and FIG. 6, the clock recovery circuit of the third embodiment differs from the first embodiment in that the single differential amplifier 313 which outputs differential signals in the potential difference detection circuit 31 in the duty cycle correction circuit 3 is replaced by two differential amplifiers, i.e., the first differential amplifier 316 which receives the differential output signals OUT and /OUT at its positive and negative logic inputs, respectively, and the second differential amplifier 317 which receives the output signals OUT and /OUT at its negative and positive logic inputs, respectively. Otherwise, the configuration is the same as that of the first embodiment shown in FIG. 6.

Figure 9:
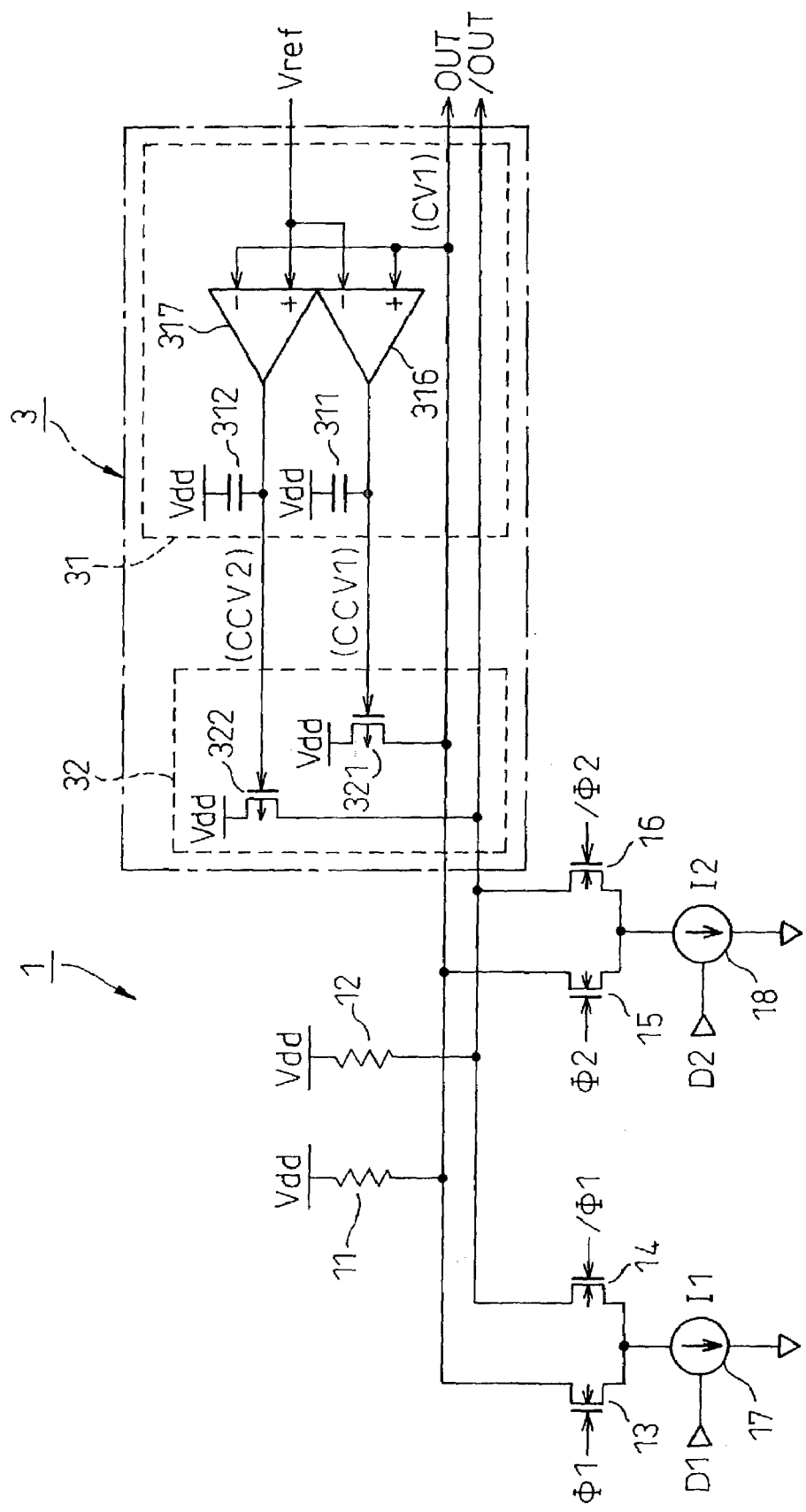
FIG. 9 is a circuit diagram showing a phase adjusting circuit and a duty cycle correction circuit according to a fourth embodiment of the clock recovery circuit of the present invention.

FIG. 9 is a circuit diagram showing a phase adjusting circuit and a duty cycle correction circuit according to a fourth embodiment of the clock recovery circuit of the present invention.

As is apparent from the comparison between FIG. 9 and FIG. 8, the clock recovery circuit of the fourth embodiment differs from the third embodiment in that, instead of the negative logic output signal /OUT, a reference voltage Vref is supplied to the first differential amplifier 316 and the second differential amplifier 317, thereby to make the center voltage (CV1) of the positive logic output signal OUT coincide with the reference voltage Vref. Here, the reference voltage Vref may be set, for example, to a voltage value equal to Vdd/2, or alternatively, it can be set to a voltage value that best matches the circuit at the next stage that receives the output (OUT, /OUT) of the clock recovery circuit.

Figure 10:
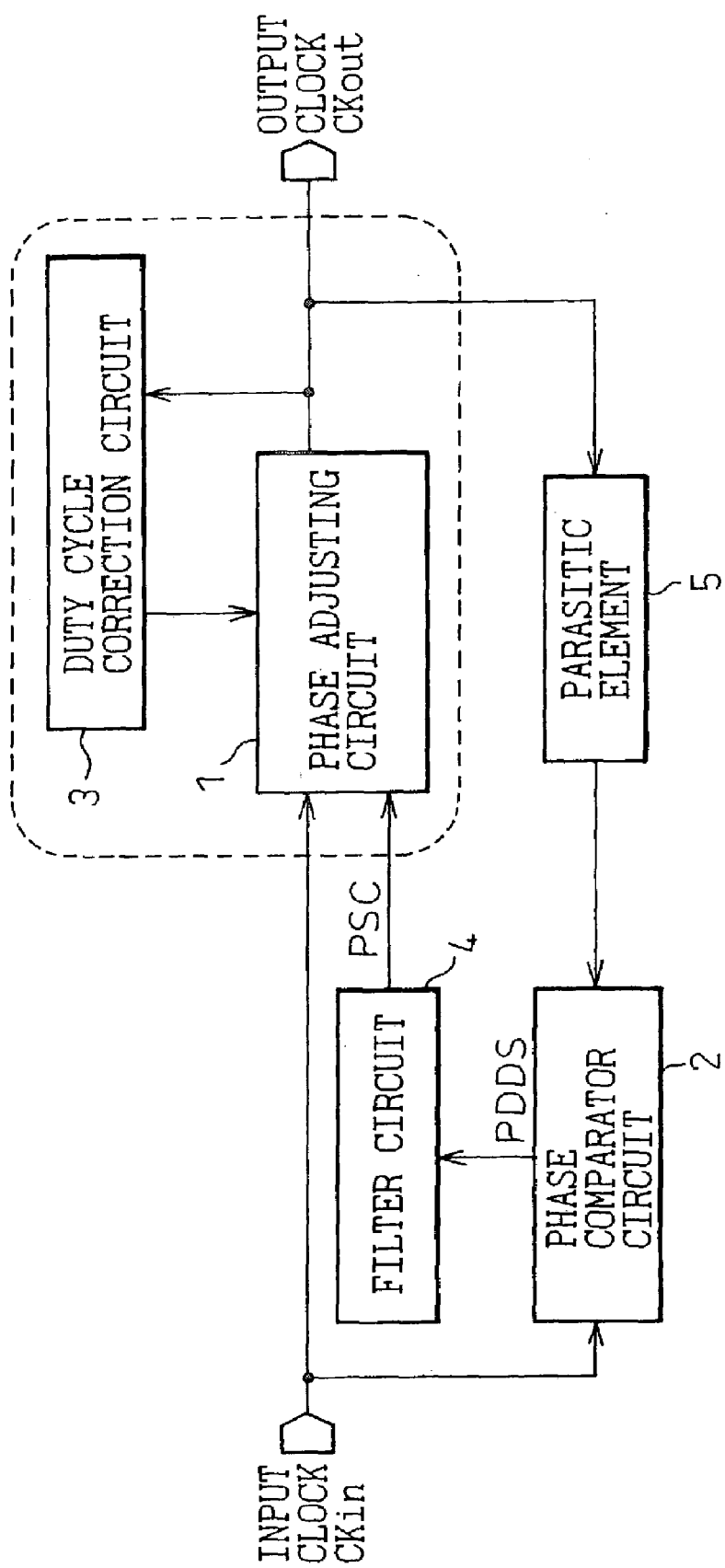
FIG. 10 is a block diagram showing a fifth embodiment of the clock recovery circuit according to the present invention.
Figure 11:
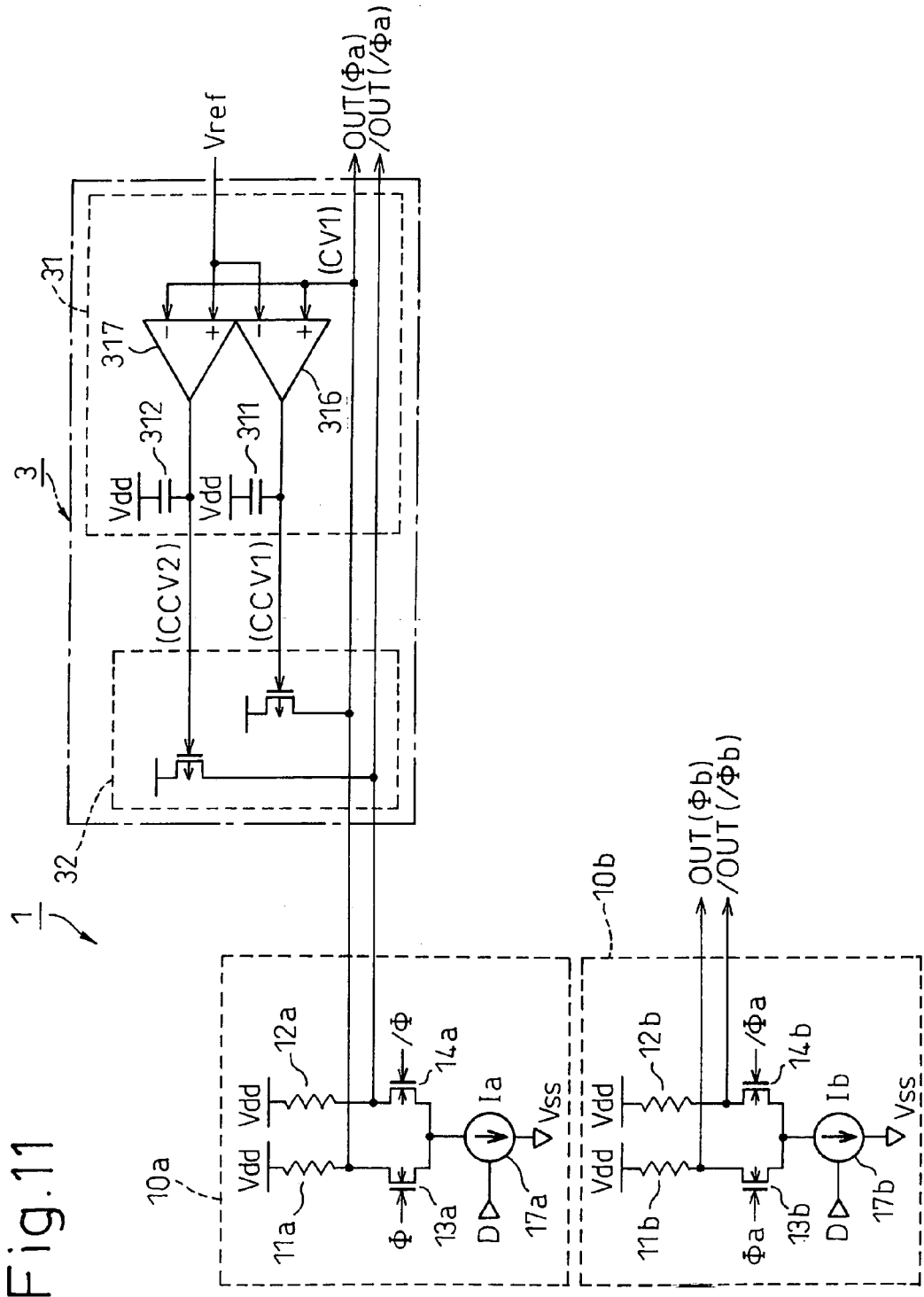
FIG. 11 is a circuit diagram showing a phase adjusting circuit and a duty cycle correction circuit in the clock recovery circuit of FIG. 10.

FIG. 10 is a block diagram showing a fifth embodiment of the clock recovery circuit according to the present invention, and FIG. 11 is a circuit diagram showing a phase adjusting circuit and a duty cycle correction circuit in the clock recovery circuit of FIG. 10. The fifth embodiment shown in FIGS. 10 and 11 concerns an example of the clock recovery circuit constructed using a DLL (Delay Locked Loop).

As shown in FIG. 10, the clock recovery circuit of the fifth embodiment comprises: a phase adjusting circuit 1 which is supplied with an input clock (input signal) CKin and a phase control signal PCS derived via a filter circuit 4 from an output (phase difference detection signal PDDS) of a phase comparator circuit 2; the phase comparator circuit 2 which is supplied with the input clock CKin and an output clock (output signal) CKout via a parasitic element 5; and a duty cycle correction circuit 3 which receives the output clock CKout and corrects the duty cycle of the output clock CKout by controlling the phase adjusting circuit 1. Here, the parasitic element 5 corresponds, for example, to a parasitic capacitor or the like present in an LSI, while the filter circuit 4 is provided to feed back the phase control signal PCS to the phase adjusting circuit 1 by buffering the phase difference detection signal PDDS output from the phase comparator circuit 2 and thereby stabilizing the phase adjusting operation.

As shown in FIG. 11, the phase adjusting circuit 1 in the clock recovery circuit of the fifth embodiment comprises a plurality of phase adjusting units (phase adjusting circuits) 10a and 10b, and the duty cycle correction circuit 3 corrects the duty cycle of the output signal OUT, /OUT (Φa, /Φa) of the first-stage phase adjusting unit 10a. Here, the duty cycle correction circuit 3 in the clock recovery circuit of the fifth embodiment is shown as having the same configuration as the duty cycle correction circuit in the clock recovery circuit of FIG. 9, but the configuration is not limited to this particular example. Further, in FIG. 11, two phase adjusting units (10a and 10b) are provided, but it will be appreciated that the number of units is not limited to two.

The differential pair transistors 13a and 14a in the first-stage phase adjusting unit 10a are supplied at their gates with reference clocks Φ and /Φ, and the outputs Φa and /Φa of the first-stage phase adjusting unit 10a are supplied as reference clocks to the gates of the differential pair transistors 13b and 14b in the second-stage phase adjusting unit 10b. Phase adjusting units 10a and 10b include loads 11a and 12a, and 11b and 12b, respectively. Phase adjusting units 10a and 10b also include respective current sources 17a and 17b. If the phase adjusting circuit consists of three phase adjusting units, the outputs Φb and /Φb of the second-stage phase adjusting unit 10b are supplied to the gates of the differential pair transistors (13c and 14c) as inputs to the third-stage phase adjusting unit (10c). Then, the outputs Φb and /Φb of the final-stage phase adjusting unit (in FIG. 11, 10b) are taken as the output signals (output clocks) of the clock recovery circuit.

In the clock recovery circuit of the above fifth embodiment, various configurations (such as shown in the first to fourth embodiments) can be applied for the construction of the duty cycle correction circuit 3. Thus, the present invention is also applicable to a clock recovery circuit constructed using a DLL.

As described in detail above, according to the present invention, a clock recovery circuit can be provided that is capable of maintaining the duty cycle of the recovered clock at a prescribed value.

Many different embodiments of the present invention may be constructed without departing from the spirit and scope of the present invention, and it should be understood that the present invention is not limited to the specific embodiments described in this specification, except as defined in the appended claims.

What is claimed is:

1. A clock recovery circuit comprising:
   a phase comparator circuit carrying out phase comparison between an input signal and an output signal, and outputting a phase control signal proportional to a phase difference between said input signal and said output signal, wherein said input signal and said output signal are each a differential signal;

a phase adjusting circuit receiving said phase control signal from said phase comparator circuit, adjusting the phase of said input signal, and producing said output signal, wherein said phase adjusting circuit comprises a mixer circuit having a plurality of differential transistor pairs to which reference clocks of different phases are input, and a plurality of current sources controlling currents flowing through said respective differential transistor pairs, wherein each of said current sources applies a weight proportional to the output of said phase comparator circuit to said reference clock supplied to the differential transistor pair corresponding to said each current source, and producing said output signal by combining the weighted reference clocks at a node to which said plurality of differential transistor pairs are connected in common; and a duty cycle correction circuit receiving said output signal from said phase adjusting circuit, and correcting the duty cycle of said output signal, wherein said duty cycle correction circuit controls the center voltage of the node to which said plurality of differential transistor pairs are connected in common, and corrects the center voltage of said output signal.

2. The clock recovery circuit as claimed in claim 1, wherein said duty cycle correction circuit corrects the duty cycle of said output signal to 50%.

3. The clock recovery circuit as claimed in claim 1, wherein said phase adjusting circuit is provided in a plurality of stages, and wherein said duty cycle correction circuit corrects the duty cycle of the output signal of the first-stage phase adjusting circuit, the output signal of said first-stage phase adjusting circuit is used as a reference clock for the next-stage phase adjusting circuit, and the output signal of the final-stage phase adjusting circuit is taken as the output signal of said clock recovery circuit.

4. A clock recovery circuit comprising:

a phase comparator circuit carrying out phase comparison between an input signal and an output signal, and outputting a phase control signal proportional to a phase difference between said input signal and said output signal, wherein said input signal and said output signal are each a differential signal;

a phase adjusting circuit receiving said phase control signal from said phase comparator circuit, adjusting the phase of said input signal, and producing said output signal, wherein said phase adjusting circuit comprises a mixer circuit having a plurality of differential transistor pairs to which reference clocks of different phases are input, and a plurality of current sources controlling currents flowing through said respective differential transistor pairs, wherein each of said current sources applies a weight proportional to the output of said phase comparator circuit to said reference clock supplied to the differential transistor pair corresponding to said each current source, and producing said output signal by combining the weighted reference clocks at a node to which said plurality of differential transistor pairs are connected in common; and a duty cycle correction circuit receiving said output signal from said phase adjusting circuit, and correcting the duty cycle of said output signal, wherein said duty cycle correction circuit corrects the center voltage of said output signal by making the center voltage of a positive logic signal in said output signal and the center voltage of a negative logic signal in said output signal coincide with each other, said duty cycle correction circuit comprising a potential difference detection circuit detecting a potential difference between the center voltage of said positive logic signal in said output signal and the center voltage of said negative logic signal in said output signal, and a feedback control circuit feedback-controlling said phase adjusting circuit by receiving an output of said potential difference detection circuit, wherein said potential difference detection circuit comprises a differential amplifier receiving said differential output signals, and said feedback control circuit comprises a pair of pull-up or pull-down transistors controlling the levels of said output signals by receiving outputs of said differential amplifier.

5. The clock recovery circuit as claimed in claim 4, wherein a capacitor connected to a high-level or low-level power supply line is provided on each of the outputs of said differential amplifier.

6. A clock recovery circuit comprising:

a phase comparator circuit carrying out phase comparison between an input signal and an output signal, and outputting a phase control signal proportional to a phase difference between said input signal and said output signal, wherein said input signal and said output signal are each a differential signal;

a phase adjusting circuit receiving said phase control signal from said phase comparator circuit, adjusting the phase of said input signal, and producing said output signal, wherein said phase adjusting circuit comprises a mixer circuit having a plurality of differential transistor pairs to which reference clocks of different phases are input, and a plurality of current sources controlling currents flowing through said respective differential transistor pairs, wherein each of said current sources applies a weight proportional to the output of said phase comparator circuit to said reference clock supplied to the differential transistor pair corresponding to said each current source, and producing said output signal by combining the weighted reference clocks at a node to which said plurality of differential transistor pairs are connected in common; and a duty cycle correction circuit receiving said output signal from said phase adjusting circuit, and correcting the duty cycle of said output signal, wherein said duty cycle correction circuit corrects the center voltage of said output signal by making the center voltage of a positive logic signal in said output signal and the center voltage of a negative logic signal in said output signal coincide with a reference voltage, said duty cycle correction circuit comprising a first potential difference detection circuit detecting a potential difference between said reference voltage and the center voltage of said positive logic signal in said output signal, a second potential difference detection circuit detecting a potential difference between said reference voltage and the center voltage of said negative logic signal in said output signal, and a feedback control circuit feedback-controlling said phase adjusting circuit by receiving outputs of said first and second potential difference detection circuits, wherein said first potential difference detection circuit comprises a first differential amplifier receiving said positive logic output signal and said reference voltage, said second potential difference detection circuit comprises a second differential amplifier receiving said negative logic output signal and said reference voltage, and said feedback control circuit comprises a pair of pull-up or pull-down transistors controlling the levels of said output signals by receiving the outputs of said first and second differential amplifiers.

7. The clock recovery circuit as claimed in claim 6, wherein a capacitor connected to a high-level or low-level power supply line is provided on each of the outputs of said first and second differential amplifiers.

* * * * *